United States Patent
Van den Bogaert

(10) Patent No.: US 6,955,772 B2
(45) Date of Patent: Oct. 18, 2005

(54) AQUEOUS COMPOSITION CONTAINING A POLYMER OR COPOLYMER OF A 3,4-DIALKOXYTHIOPHENE AND A NON-NEWTONIAN BINDER

(75) Inventor: Roger Van den Bogaert, Schoten (BE)

(73) Assignee: Agfa-Gevaert, Mortsel (BE)

( * ) Notice: Subject to any disclaimer, the term of this patent is extended or adjusted under 35 U.S.C. 154(b) by 116 days.

(21) Appl. No.: 10/105,758

(22) Filed: Mar. 25, 2002

(65) Prior Publication Data

US 2003/0062510 A1 Apr. 3, 2003

Related U.S. Application Data

(60) Provisional application No. 60/349,572, filed on Jan. 18, 2002, and provisional application No. 60/294,325, filed on May 30, 2001.

(30) Foreign Application Priority Data

Mar. 29, 2001 (EP) .............................. 01000098
Dec. 10, 2001 (EP) .............................. 01000730

(51) Int. Cl.$^7$ ............................................... H01B 1/20
(52) U.S. Cl. ........................... 252/500; 174/257; 427/96; 427/372.2
(58) Field of Search ......................... 252/500; 174/257; 427/96, 372.2

(56) References Cited

U.S. PATENT DOCUMENTS

| | | | |
|---|---|---|---|
| 3,928,281 A | | 12/1975 | Uchigaki et al. |
| 3,957,555 A | | 5/1976 | Bondi |
| 4,515,646 A | | 5/1985 | Walker et al. |
| 4,649,224 A | | 3/1987 | Panek et al. |
| 4,696,849 A | | 9/1987 | Mobley et al. |
| 4,709,099 A | | 11/1987 | Panek et al. |
| 4,853,054 A | | 8/1989 | Turner et al. |
| 5,045,375 A | | 9/1991 | Davis et al. |
| 5,158,922 A | | 10/1992 | Hinney et al. |
| 5,354,613 A | * | 10/1994 | Quintens et al. ............. 428/341 |
| 5,401,537 A | | 3/1995 | Kochem et al. |
| 5,482,908 A | | 1/1996 | Le-Khac |
| 5,604,267 A | | 2/1997 | Duffy |
| 5,652,067 A | | 7/1997 | Ito et al. |
| 5,766,515 A | | 6/1998 | Jonas et al. |
| 5,767,624 A | | 6/1998 | Gordon, II et al. |
| 6,004,483 A | | 12/1999 | Jonas et al. |
| 6,083,635 A | * | 7/2000 | Jonas et al. ................ 428/690 |
| 6,084,040 A | | 7/2000 | Jonas et al. |
| 6,171,678 B1 | | 1/2001 | Holeschovsky et al. |
| 6,328,833 B1 | | 12/2001 | Holeschovsky et al. |
| 6,358,437 B1 | * | 3/2002 | Jonas et al. ................ 252/500 |
| 6,376,105 B1 | | 4/2002 | Jonas et al. |
| 6,632,472 B2 | * | 10/2003 | Louwet et al. ............ 427/126.1 |
| 2003/0057403 A1 | | 3/2003 | Willaert et al. |
| 2003/0144465 A1 | | 7/2003 | Leenders et al. |

FOREIGN PATENT DOCUMENTS

| | | |
|---|---|---|
| DE | 196 27 071 A1 | 1/1998 |
| EP | 0 589 529 A1 | 3/1994 |
| EP | 0 686 662 A2 | 12/1995 |
| EP | 0 593 111 B1 | 6/1998 |
| EP | 1 003 179 A1 | 5/2000 |
| EP | 1 081 549 A1 | 3/2001 |
| WO | WO 99/34371 A1 | 7/1999 |
| WO | WO 99/66483 A1 | 12/1999 |
| WO | WO 02/000759 A1 | 1/2002 |

OTHER PUBLICATIONS

Kelzan Xanthan Gum (CPKelco Indus) Product Data Sheet(s). www.cpkelco.com/xanthan/industrial.*
U.S. Appl. No. 60/214,418, filed Jun. 28, 2000.*
Carter et al; "Polymeric Anodes for Improved Polymer Light–Emitting Diode Performance" *Applied Physics Letters*, vol. 70 (16), 2067–2069 (Apr. 21, 1997).
Search Report for EP 01 00 0098 (Sep. 5, 2001).
U.S. Appl. No. 10/614,148, Willaert et al., filed Jul. 7, 2003.
Baytron® P product description, www.bayer–echemicals.com, no date.

* cited by examiner

*Primary Examiner*—Mark Kopec
(74) *Attorney, Agent, or Firm*—Leydig, Voit & Mayer, Ltd.

(57) ABSTRACT

An aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder; a method for preparing a conductive layer comprising: applying the above-described aqueous composition to an optionally subbed support, a dielectric layer, a phosphor layer or an optionally transparent conductive coating; and drying the thereby applied aqueous composition; antistatic and electroconductive coatings prepared according to the above-described method for preparing a conductive layer; a printing ink or paste comprising the above-described aqueous composition; and a printing process comprising: providing the above-described printing ink; printing the printing ink on an optionally subbed support, a dielectric layer, a phosphor layer or an optionally transparent conductive coating.

14 Claims, No Drawings

AQUEOUS COMPOSITION CONTAINING A POLYMER OR COPOLYMER OF A 3,4-DIALKOXYTHIOPHENE AND A NON-NEWTONIAN BINDER

This application claims the benefit of U.S. Provisional Application No. 60/294,325 filed May 30, 2001 and the benefit of U.S. Provisional Application No. 60/349,572 filed Jan. 18, 2002, both of which are incorporated by reference.

FIELD OF THE INVENTION

The present invention relates to method of preparing a aqueous composition containing a polymer or copolymer of a 3,4-dialkoxythiophene and non-aqueous solvent.

BACKGROUND OF THE INVENTION

U.S. Pat. No. 5,494,609 discloses an electrically conductive coating composition comprising: a dispersion comprising dispersed particle of an intrinsically conductive polymer and, a solution which comprises a hydrophobic film-forming thermoplastic polymer, a highly polar plasticizer, and, an acid anhydride surfactant, in an organic solvent; wherein said thermoplastic polymer is soluble in said solvent to at least 1 percent by weight; and, wherein said dispersion comprises from about to 1 to about 50 percent by weight of said intrinsically conductive polymer.

EP-A 440 957 discloses dispersions of polythiophenes, constructed from structural units of formula (I):

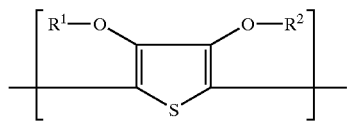

in which $R^1$ and $R^2$ independently of one another represent hydrogen or a $C_{1-4}$-alkyl group or together form an optionally substituted $C_{1-4}$-alkylene residue, in the presence of polyanions.

EP-A-686 662 discloses mixtures of A) neutral polythiophenes with the repeating structural unit of formula (I),

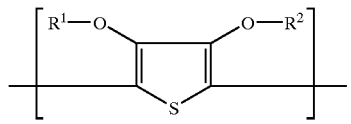

in which $R^1$ and $R^2$ independently of one another represent hydrogen or a $C_{1-4}$-alkyl group or together represent an optionally substituted $C_{1-4}$-alkylene residue, preferably an optionally with alkyl group substituted methylene, an optionally with $C_{1-12}$-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered to increase their resistance preferably to <300 ohm/square.

EP-A 1 003 179 discloses a method for producing a polymeric conductive layer on an object comprising the steps of: providing an aqueous composition containing a polythiophene, a polyanion compound and an aprotic compound with a dielectric constant grater than 15.

WO 99/34371 discloses a silk screen paste with a viscosity of 1 to 200 dPa.s ($10^2$ to $2\times10^4$ mPa.s) containing a solution or dispersion of a conductive polymer paste and optionally binders, thickeners and fillers. WO 99/34371 also discloses a process for preparing silk screen pastes in which a solution or dispersion with a content of <2% by weight of poly(3,4-ethylenedioxythiophene) [PEDOT]/poly(styrene sulfonate) {PSS} is concentrated to a solids content of >2% by weight by removing the solvent and subsequently optionally adding binder and/or filler. EXAMPLE 2 of WO 99/34371 discloses the use of the binder MIROX® TBN, a copolymer of sodium polyacrylate and NP 14-methacrylate from Stockhausen, in a PEDOT/PSS-containing silk screen paste.

EP-A 1 081 549 discloses a coating composition comprising a solution of a substituted or unsubstituted thiophene-containing electrically-conductive polymer, a film-forming binder, and an organic solvent media; the media having a water content of less than 37 weight percent. Coating dispersions with 0.1% by weight of PEDOT and with between 8 and 25% by weight of water were disclosed in the invention examples using a 1.22% by weight dispersion of PEDOT/PSS in water as the starting material.

EP-A 1 081 546 discloses a coating composition comprising a solution of an electrically-conductive polymer and an organic solvent media wherein the solvents are selected from the group consisting of alcohols, ketones, cycloalkanes, arenes, esters, glycol ethers and their mixtures; the media having a water content of less than 12 weight percent. Coating dispersions with PEDOT concentrations between 0.02 and 0.1% by weight and with between 2 and 8% by weight of water were disclosed in the invention examples using a 1.22% by weight dispersion of PEDOT/ PSS in water as the starting material.

EP-A 1 081 548 discloses a coating composition comprising a substituted or unsubstituted thiophene-containing electrically-conductive polymer and an organic solvent media; the media having a water content of less than 12 weight percent. Coating dispersions with PEDOT concentrations between 0.02 and 0.1% by weight and with between 2 and 8% by weight of water were disclosed in the invention examples using a 1.22% by weight dispersion of PEDOT/ PSS in water as the starting material.

There is a need for aqueous dispersions, printing inks and printing pastes for providing conductive layers with improved coating and/or printing properties.

ASPECTS OF THE INVENTION

It is therefore an aspect of the present invention to provide an improved aqueous composition comprising a polymer or copolymer of a 3,4-dialkoxythiophene and non-aqueous solvent for providing conductive layers.

It is therefore a further aspect of the present invention to provide a method for preparing a conductive layer using an improved aqueous composition comprising a polymer or copolymer of a 3,4-dialkoxythiophene and non-aqueous solvent.

It is therefore also an aspect of the present invention to provide an antistatic layer prepared according to a method for preparing a conductive layer using an improved aqueous composition comprising a polymer or copolymer of a 3,4-dialkoxythiophene and non-aqueous solvent.

It is therefore also an aspect of the present invention to provide an electroconductive layer prepared according to a method for preparing a conductive layer using an improved aqueous composition comprising a polymer or copolymer of a 3,4-dialkoxythiophene and non-aqueous solvent.

It is therefore also an aspect of the present invention to provide an improved printing ink or paste comprising an improved aqueous composition comprising a polymer or copolymer of a 3,4-dialkoxythiophene and non-aqueous solvent.

It is therefore also an aspect of the present invention to provide a printing process for applying an improved aqueous composition comprising a polymer or copolymer of a 3,4-dialkoxythiophene and non-aqueous solvent.

Further aspects and advantages of the invention will become apparent from the description hereinafter.

SUMMARY OF THE INVENTION

EXAMPLE 2 of WO 99/34371 discloses that addition of 2.6 g of sodium polyacrylate (MIROX® TBN, a 20% by weight aqueous solution of a copolymer of sodium polyacrylate and NP 14-methacrylate from Stockhausen GmbH, Krefeld, Germany) and 51.5 g of methoxypropylacetate increased the viscosity of a dispersion prepared by mixing 225 g of a 3% by weight dispersion of PEDOT/PSS (1:2.4 by weight), 25 g of N-methylpyrrolidinone and 7.5 g of 3-glycidoxypropyltrimethoxysilane from 800 mPa.s to 3000 mPa.s. The concentration of the copolymer of sodium polyacrylate and NP 14-methacrylate in MIROX® TBN in the final dispersion is 0.17% by weight. A 0.2% by weight solution of the copolymer of sodium polyacrylate and NP 14-methacrylate in MIROX® TBN at pH's of 1.8 or 8.0 exhibits a viscosity, which is substantially independent of shear rate i.e. Newtonian behaviour according to the present invention. Surprisingly it has been found that by using a binder which exhibits non-Newtonian behaviour in aqueous solution (i.e. whose aqueous solution exhibits a viscosity which is substantially dependent upon shear rate), aqueous pastes and inks can be obtained which can be satisfactorily printed at lower PEDOT/PSS- and binder-contents.

Typical aqueous pastes comprising a polymer or copolymer of a (3,4-dialkoxythiophene) have a pH of about 2.0, because A. N. Aleshin et al. showed in 1998 in Synthetic Metals, volume 94, pages 173–177, that pH's above 3 lead to a dramatic decrease in electrical conductivity. However, it has been found that pastes having a pH of up to 7 used in producing an electrode of an electroluminescent lamp comprising a polymer or copolymer of a 3,4-dialkoxythiophene, a polyacrylate thickener and a glycol derivative, and optionally a surfactant, exhibit surface resistances ≦1000 Ω/square at visual transmissions >75%, which are not significantly higher than those typically observed for pastes having pH's ≦3.

Aspects of the present invention are realized by an aqueous composition containing a polymer or copolymer of a 3,4-dialkoxythiophene in which the two alkoxy groups may be the same or different or together represent an optionally substituted oxy-alkylene-oxy bridge, a polyanion and a binder, characterized in that aqueous solutions of the binder exhibit a non-Newtonian behaviour.

Aspects of the present invention are also realized by a method for preparing a conductive layer comprising: applying the above-described aqueous composition to an optionally subbed support, a dielectric layer, a phosphor layer or an optionally transparent conductive coating; and drying the thereby applied aqueous composition.

Aspects of the present invention are also provided by an antistatic layer prepared according to the above-described method.

Aspects of the present invention are also provided by an electroconductive layer prepared according to the above-described method.

Aspects of the present invention are also provided by a printing ink or paste comprising the above-described aqueous composition.

Aspects of the present invention are also provided by a printing process comprising: providing the above-described printing ink or paste; printing the printing ink or paste on an optionally subbed support, a dielectric layer, a phosphor layer or an optionally transparent conductive coating.

Further aspects of the present invention are disclosed in the dependent claims.

DETAILED DESCRIPTION OF THE INVENTION

Definitions

The term Newtonian behaviour refers to a viscosity with no more than 10% variation in the shear rate range 1 to 80 $s^{-1}$ measured with increasing shear rate for concentrations in the medium concerned up to 2% by weight in the absence of other ingredients.

The term non-Newtonian behaviour refers to a viscosity with more than 10% variation in the shear rate range 1 to 80 $s^{-1}$ measured with increasing shear rate for concentrations in the medium concerned below 2% by weight and in the absence of other ingredients.

The term alkoxy means all variants possible for each number of carbon atoms in the alkoxy group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term oxyalkylenealkoxy means two oxygen atoms linked by an alkylene group. An alkylene group is a substituted or unsubstituted hydrocarbon group e.g. a —$(CH_2)_n$— group where n is an integer between 1 and 5, which may be substituted with an alkoxy, aryloxy, alkyl, aryl, alkaryl, alkyloxyalkyl, alkyloxyalkaryl, alkyloxyaryl, hydroxy, carboxy, carboxyalkyl, carboxyamino, sulfo or alkylsulfo group.

The term derivatives as used in connection with a particular polymer refers to variants thereof substituted with alkyl, alkoxy, alkyloxyalkyl, carboxy, alkylsulfonato and carboxy ester groups.

The term aqueous medium means a medium consisting entirely of water or a medium consisting of a mixture of water with one or more water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methyl pyrrolidone; methoxypropanol; and ketones e.g. 2-propanone and 2-butanone etc. in which at least 50% by volume of water is present.

The term conductive layer as used in disclosing the present invention includes both electroconductive coatings and antistatic layers.

The term electroconductive means having a surface resistivity below $10^6$ Ω/square.

The term antistatic means having a surface resistivity in the range from $10^6$ to $10^{11}$ Ω/square meaning it cannot be used as an electrode.

The term "conductivity enhancement" refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in a conductivity increase. Alternatively in the case of aprotic compounds with a dielectric constant ≧15, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179.

The term transparent as used in disclosing the present invention means having the property of transmitting at least 70% of the incident light without diffusing it.

The term translucent as used in disclosing the present invention means allowing the passage of light, yet diffusing it so as not to render bodies lying beyond clearly visible.

Coating is a process in which a continuous or discontinuous layer is formed and includes printing techniques such as screen printing, offset printing and flexographic printing.

The term flexible as used in disclosing the present invention means capable of following the curvature of a curved object such as a drum e.g. without being damaged.

The term busbar refers to a highly conducting generally metal particle-containing electrode applied to at least part of the surface of the first transparent or translucent electrode and to at least part of the surface of the second conductive electrode.

PEDOT as used in the present disclosure represents poly(3,4-ethylenedioxythiophene).

PSS as used in the present disclosure represents poly(styrene sulphonic acid) or poly(styrene sulphonate).

PET as used in the present disclosure represents poly(ethylene terephthalate).

Aqueous Composition

Aspects of the present invention are realized by an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder.

According to a first embodiment of the aqueous composition, according to the present invention, the pH of the aqueous composition has a value ≧4.

Polymer or Copolymer of a 3,4-dialkoxythiophene

According to a second embodiment of the aqueous composition, according to the present invention, the polymer or copolymer of a (3,4-dialkoxythiophene) has the formula

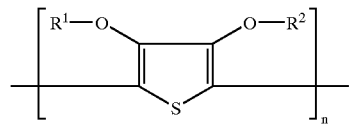

in which, each of R¹ and R² independently represents hydrogen or a $C_{1-4}$ alkyl group or together represent an optionally substituted $C_{1-5}$-alkylene group or a cycloalkylene group.

According to a third embodiment of the aqueous composition, according to the present invention, the polymer or copolymer of a 3,4-dialkoxythiophene is a polymer or copolymer of a 3,4-dialkoxythiophene in which the two alkoxy groups together represent an optionally substituted oxy-alkylene-oxy bridge.

According to a fourth embodiment of the aqueous composition, according to the present invention, the polymers or copolymers of a 3,4-dialkoxy-thiophene are polymers or copolymers of a 3,4-dialkoxythiophene in which the two alkoxy groups together represent an optionally substituted oxy-alkylene-oxy bridge are selected from the group consisting of: poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene) and poly(3,4-butylenedioxythiophene) derivatives and copolymers thereof.

According to a fifth embodiment of the aqueous composition, according to the present invention, the polymers or copolymers of a (3,4-dialkoxy-thiophenes), the substituents for the oxy-alkylene-oxy bridge are alkyl, alkoxy, alkyloxyalkyl, carboxy, alkylsulfonato, arylsulfonato and carboxy ester groups.

According to a sixth embodiment of the aqueous composition, according to the present invention, in the poly(3,4-dialkoxy-thiophenes) the two alkoxy groups together represent an optionally substituted oxy-alkylene-oxy bridge which is a 1,2-ethylene group, an optionally alkyl-substituted methylene group, an optionally $C_{1-12}$-alkyl-substituted 1,2-ethylene group, an optionally phenyl-substituted 1,2-ethylene group, a 1,3-propylene group or a 1,2-cyclohexylene group.

Such polymers are described in Handbook of Oligo- and Polythiophenes Edited by D. Fichou, Wiley-VCH, Weinheim (1999); by L. Groenendaal et al. in Advanced Materials, volume 12, pages 481–494 (2000); L. J. Kloeppner et al. in Polymer Preprints, volume 40(2), page 792 (1999); P. Schottland et al. in Synthetic Metals, volume 101, pages 7–8 (1999); and D. M. Welsh et al. in Polymer Preprints, volume 38(2), page 320 (1997).

Polyanion

According to a seventh embodiment of the aqueous composition, according to the present invention, polyanions include the polyanions of polymeric carboxylic acids, e.g. polyacrylic acids, polymethacrylic acids, or polymaleic acids and polysulphonic acids, e.g. poly(styrene sulphonic acid). These polycarboxylic acids and polysulphonic acids can also be copolymers of vinylcarboxylic acids and vinylsulphonic acids with other polymerizable monomers, e.g. acrylic acid esters, methacrylic acid esters and styrene.

According to an eighth embodiment of the aqueous composition, according to the present invention, the polyanion is a polyanion of poly(styrene sulphonic acid) or of copolymers of poly(styrene sulphonic acid) with styrene.

Water-Miscible Organic Solvents

According to a ninth embodiment of the aqueous composition, according to the present invention, the aqueous composition further contains a water-miscible organic solvent.

According to a tenth embodiment of the aqueous composition, according to the present invention, the aqueous composition further contains a water-miscible organic solvent which is selected from the group consisting of alcohols, ketones, cycloalkanes, arenes, esters, glycol ethers and their mixtures.

According to an eleventh embodiment of the aqueous composition, according to the present invention, the aqueous composition further contains a water-miscible organic solvent which is a di- or polyhydroxy- and/or carboxy groups or amide or lactam group containing organic compound, for example sugar alcohols, such as sorbitol, mannitol, saccharaose and fructose, diethylene glycol, 1,2-propandiol, propylene glycol N-methyl pyrrolidinone, or an aprotic liquid with a dielectric constant greater than 15.

According to a twelfth embodiment of the aqueous composition, according to the present invention, the aqueous composition further contains a water-miscible organic solvent which is selected from the group consisting of 1,2-propandiol, propylene glycol, diethylene glycol, N-methyl pyrrolidinone, N,N-dimethylformamide, N-methylacetamide, tetrafurfurylalcohol, N,N-dimethylacetamide, glycerol, hexylene glycol, ethanol and carbitol acetate.

The suitability of particular water-miscible organic solvent can be evaluated by mixing 8 g of a 1.2% by weight aqueous dispersion of PEDOT/PSS with 12 g of the water-miscible organic solvent. If miscibility is observed without gel formation, the non-aqueous solvent is regarded as suitable. Tetrahydrofuran is miscible, but the dispersions are very viscous. Suitability according to the above miscibility test does not rule out phase separation upon further dilution of the PEDOT/PSS-dispersion with the same solvent, as is observed with tetrahydrofuran. It will be understood by one skilled in the art that a PEDOT/PSS-dispersion cannot be diluted to an unlimited extent without the possibility of phase separation.

Ethyl lactate induces gel-formation and hence is unsuitable. Benzyl alcohol and furfuryl alcohol produce phase separation and hence are unsuitable.

Non-Newtonian Binders

Aspects of the present invention are realized by an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder, wherein aqueous solutions of the binder exhibit a non-Newtonian behaviour.

Non-Newtonian binders bind the ingredients of the electroconductive layers together and substantially increase the viscosity of aqueous solutions at concentrations by weight of less than 2%.

Polyacrylates and polysaccharides exhibiting non-Newtonian behaviour in aqueous solution are suitable non-Newtonian binders for use in the aqueous compositions according to the present invention. Polysaccharides which substantially increase the viscosity of aqueous solutions include cellulose, cellulose derivatives, e.g. carboxymethyl cellulose, guar gum and xanthan gum.

The difference in rheological behaviour for non-Newtonian and Newtonian binders is evident from the dependence of the viscosity of their solutions upon shear rate. Table 1 gives the viscosity as a function of shear rate determined using an AR1000 plate and cone rheometer (diameter 4 cm; cone angle 2°) at 20° C. with increasing shear rate for 1% by weight solutions of CARBOPOL™ ETD 2623, a non-Newtonian polyacrylate binder, 0.2% by weight solutions of the copolymer of sodium polyacrylate and NP 14-methacrylate in MIROX™ TBN, a Newtonian polyacrylate binder, at different pH's and 2% by weight solutions of MIROX™ TBN in Table 1.

TABLE 1

Viscosity [mPa.s] at 20° C.

| Shear rate $[s^{-1}]$ | 1% by weight CARBOPOL™ ETD 2623 solution in water pH = 3.2 | 1% by weight CARBOPOL™ ETD 2623 solution in water pH = 5.2 | aq. solution of copolymer of sodium polyacrylate & NP 14-methacrylate in MIROX™ TBN 0.2% by weight pH = 1.8 | aq. solution of copolymer of sodium polyacrylate & NP 14-methacrylate in MIROX™ TBN 0.2% by weight pH = 8.0 | 2% by weight pH = 7.2 |
|---|---|---|---|---|---|
| 0.10 | | | | | 375.9 |
| 0.25 | | | | | 365.8 |
| 0.40 | | | | | 363.0 |
| 0.63 | | | | | 358.9 |
| 1.00 | | | | | 357.0 |
| 1.18 | | | | 4.9 | |
| 1.20 | 7897 | 68620 | | | |
| 1.59 | | | | | 353.9 |
| 2.20 | | | 1.6 | | |
| 2.30 | | | | 4.8 | |
| 2.38 | 3296 | 42610 | | | |
| 2.51 | | | | | 349.8 |
| 3.98 | | | | | 346.2 |
| 4.55 | | | 1.5 | | |
| 4.67 | | | | 4.8 | |
| 4.75 | | 26710 | | | |
| 4.76 | 1520 | | | | |
| 5.89 | | | | | 372.0 |
| 7.28 | | | 1.5 | | |
| 7.29 | | | | 4.9 | |
| 7.54 | 994.2 | 19530 | | | |
| 10.0 | | | | | 352.8 |
| 14.54 | | | 1.5 | | |
| 14.95 | | | | 4.7 | |
| 15.04 | 565.9 | 12070 | | | |
| 15.85 | | | | | 372.0 |
| 25.12 | | | | | 394.9 |
| 29.57 | | | 1.5 | | |
| 30.00 | 337.5 | 7554 | | | |
| 30.21 | | | | 4.7 | |
| 39.81 | | | | | 396.6 |
| 63.10 | | | | | 365.7 |
| 75.13 | | | 1.5 | | |
| 75.36 | 177.4 | 4180 | | | |
| 77.15 | | | | 4.6 | |

Non-Newtonian binders for use in the present invention include high molecular weight homo- and copolymers of acrylic acid crosslinked with a polyalkenyl polyether, such as the CARBOPOL® resins of B. F. Goodrich e.g. CARBOPOL® ETD 2623, and xanthan gum, e.g. BIOSAN® S from Hercules Inc., USA and Kelzan® T from MERCK & Co., Kelco Division, USA.

According to a thirteenth embodiment of the aqueous composition, according to the present invention, the non-Newtonian binder is selected from the group consisting of polyacrylates and polysaccharides.

According to a fourteenth embodiment of the aqueous composition, according to the present invention, the non-Newtonian binder is a hompolymer or copolymer of acrylic acid crosslinked with a polyalkenyl polyether.

Newtonian Binders

According to a fifteenth embodiment of the aqueous composition, according to the present invention, the aqueous composition further contains a Newtonian binder, see above definition.

Addition of the Newtonian binder to the aqueous composition, according to the present invention, may improve the coating quality on non-planar structures. Such binders may also increase the viscosity of aqueous solutions, but not substantially.

According to a sixteenth embodiment of the aqueous composition, according to the present invention, the Newtonian binder is selected from the group consisting of polyacrylates, carboxymethylcellulose, polyvinylpyrrolidone, hydroxypropylcellulose, carboxylate-containing copolymers with sulfonic acid groups, hydroxy-modified acrylic acid copolymers and poly(vinyl alcohol).

A suitable Newtonian binder is MIROX™ TBN, supplied as a 20% by weight aqueous solution of a copolymer of sodium acrylate and NP 14-methacrylate by Stockhausen GmbH, Krefeld, Germany.

Pigments and Dyes

According to a seventeenth embodiment of the aqueous composition, according to the present invention, the aqueous composition further contains a pigment or dye to provide coloured or non-transparent aqueous compositions. Transparent coloured compositions can be realized by incorporating coloured dyes or pigments e.g. Rhodamine 6G, copper phthalocyanine and phthalocyanine pigments such as Flexonyl® Blau BZG, a blue-green pigment from BAYER.

Non-transparent compositions can also be realized by incorporating a black pigment such as Levanyl® A-SF from BAYER, KL1925, a carbon black dispersion from Degussa, and MHI Black 8102M, a carbon black dispersion from Mikuni, or titanium dioxide pigments in a weight sufficient to give non-transparency in the layer thickness being coated.

Crosslinking Agents

According to an eighth embodiment of the aqueous composition, according to the present invention, the aqueous composition further contains a cross-linking agent.

Suitable cross-linking agents are epoxysilanes (e.g 3-glycidoxypropyltrimethoxysilane), hydrolysis products of silanes (e.g. hydrolysis products of tetraethyoxysilane or tetramethoxysilane) as disclosed in EP 564 911, herein incorporated by reference, and di- or oligo-isocyanates optionally in blocked form.

Anti-foaming Agents

According to a nineteenth embodiment of the aqueous composition, according to the present invention, the aqueous composition further contains an anti-foaming agent. A suitable anti-foaming agent is the silicone antifoam agent X50860A.

Surfactants

According to a twentieth embodiment of the aqueous composition, according to the present invention, the aqueous composition further contains a surfactant.

According to a twenty-first embodiment of the aqueous composition, according-to the present invention, the aqueous composition further contains an anionic or non-ionic surfactant.

According to a twenty-second embodiment of the aqueous composition, according to the present invention, the aqueous composition further contains a non-ionic surfactant.

According to a twenty-third embodiment of the aqueous composition, according to the present invention, the aqueous composition further contains a non-ionic surfactant selected from the group of surfactants consisting of ethoxylated/fluroalkyl surfactants, polyethoxylated silicone surfactants, polysiloxane/polyether surfactants, ammonium salts of perfluro-alkylcarboxylic acids, polyethoxylated surfactants and fluorine-containing surfactants.

Suitable Non-ionic Surfactants Are:

Surfactant no. 01=ZONYL® FSN, a 40% by weight solution of $F(CF_2CF_2)_{1-9}CH_2CH_2O(CH_2CH_2O)_xH$ in a 50% by weight solution of isopropanol in water where x=0 to about 25, from DuPont;

Surfactant no. 02=ZONYL® FSN-100: $F(CF_2CF_2)_{1-9}CH_2CH_2O(CH_2CH_2O)_xH$ where x=0 to about 25, from DuPont;

Surfactant no. 03=ZONYL® FS300, a 40% by weight aqueous solution of a fluorinated surfactant, from DuPont;

Surfactant no. 04=ZONYL® FSO, a 50% by weight solution of $F(CF_2CF_2)_{1-7}CH_2CH_2O(CH_2CH_2O)_yH$ where y=0 to ca. 15 in a 50% by wt. solution of ethylene glycol in water, from DuPont;

Surfactant no. 05=ZONYL® FSO-100, a mixture of ethoxylated non-fluoro-surfactant with the formula: $F(CF_2CF_2)_{1-7}CH_2CH_2O(CH_2CH_2O)_yH$ where y=0 to ca. 15, from DuPont;

Surfactant no. 06=Tegoglide® 410, a polysiloxane-polymer copolymer surfactant, from Goldschmidt;

Surfactant no. 07=Tegowet®, a polysiloxane-polyester copolymer surfactant, from Goldschmidt;

Surfactant no. 08=FLUORAD® FC431: $CF_3(CF_2)_7SO_2(C_2H_5)N-CH_2CO-(OCH_2CH_2)_nOH$ from 3M;

Surfactant no. 09=FLUORAD® FC126, a mixture of the ammonium salts of perfluorocarboxylic acids, from 3M;

Surfactant no. 10=Polyoxyethylene-10-lauryl ether

A particularly preferred non-ionic surfactant is ZONYL® FSO 100.

Suitable Anionic Surfactants Are:

Surfactant no. 11=ZONYL® 7950, a fluorinated surfactant, from DuPont;

Surfactant no. 12=ZONYL® FSA, 25% by weight solution of $F(CF_2CF_2)_{1-9}CH_2CH_2SCH_2CH_2COOLi$ in a 50% by weight solution of isopropanol in water, from DuPont;

Surfactant no. 13=ZONYL® FSE, a 14% by weight solution of $[F(CF_2CF_2)_{1-7}CH_2CH_2O]_xP(O)(ONH_4)_y$ where x=1 or 2; y=2 or 1; and x+y=3 in a 70% by wt solution of ethylene glycol in water, from DuPont;

Surfactant no. 14=ZONYL® FSJ, a 40% by weight solution of a blend of $F(CF_2CF_2)_{1-7}CH_2CH_2O]_xP(O)(ONH_4)_y$ where x=1 or 2; y=2 or 1; and x+y=3 with a hydrocarbon surfactant in 25% by weight solution of isopropanol in water, from DuPont;

Surfactant no. 15=ZONYL® FSP, a 35% by weight solution of $[F(CF_2CF_2)_{1-7}CH_2CH_2O]_xP(O)(ONH_4)_y$ where x=1 or 2; y=2 or 1 and x+y=3 in 69.2% by weight solution of isopropanol in water, from DuPont;

Surfactant no. 16=ZONYL® UR: $[F(CF_2CF_2)_{1-7}CH_2CH_2O]_x P(O) (OH)_y$ where x=1 or 2; y=2 or 1 and x+y=3, from DuPont;

Surfactant no. 17=ZONYL® TBS: a 33% by weight solution of $F(CF_2CF_2)_{3-8}CH_2CH_2SO_3H$ in a 4.5% by weight solution of acetic acid in water, from DuPont;

Surfactant no. 18=Ammonium salt of perfluoro-octanoic acid;

Method for Preparing an Aqueous Composition

Aspects of the present invention are realized by a method for preparing an aqueous composition, according to the present invention, comprising: adding the ingredients in any order.

According to a first embodiment of the method for preparing an aqueous composition, according to the present invention, an aqueous dispersion of a polymer or copolymer of a 3,4-dialkoxythiophene with a polyanion is first prepared and the other ingredients are added in any order to the aqueous dispersion of a polymer or copolymer of a 3,4-dialkoxythiophene with a polyanion.

According to a second embodiment of the method for preparing an aqueous composition, according to the present invention, the pH is adjusted to a value ≧4 after all the ingredients have been added i.e. in the final step before the aqueous composition is used. In this way any disadvantageous effects resulting from the high pH during storage can be eliminated.

According to a third embodiment of the method for preparing an aqueous composition, according to the present invention, contains a non-aqueous solvent and the ingredients except the non-aqueous solvent are first mixed; the pH is optionally adjusted to a value ≧4; and finally the non-aqueous solvent added e.g. immediately before the aqueous composition is used. In this way any disadvantageous effects resulting from the presence of the non-aqueous solvent during storage can be eliminated.

Method for Preparing a Conductive Layer

Aspects of the present invention are realized by a method for preparing a conductive layer comprising: applying an aqueous composition, according to the present invention, to an optionally subbed support, a dielectric layer, a phosphor layer or an optionally transparent conductive coating; and drying the thereby applied aqueous composition.

According to a first embodiment of the method for preparing a conductive layer, according to the present invention, the support is paper, polymer film, glass or ceramic.

According to a second embodiment of the method for preparing a conductive layer, according to the present invention, the support is a natural yarn, a synthetic yarn, a natural fibre, a synthetic fibre, a textile fibre, a sheet or a web material.

According to a third embodiment of the method for preparing a conductive layer, according to the present invention, the method further comprises tempering the conductive coating to increase the surface resistivity thereof.

According to a fourth embodiment of the method for preparing a conductive layer, according to the present invention, the method further comprises wetting the conductive layer with a di- or polyhydroxy- and/or carboxy groups or amide or lactam group containing organic compound or an aprotic liquid with a dielectric constant greater than 15 prior to tempering.

According to a fifth embodiment of the method for preparing a conductive layer, according to the-present invention, the method further comprises wetting the conductive layer with a di- or polyhydroxy- and/or carboxy groups or amide or lactam group containing organic compound prior to tempering at a temperature greater than 100° C., as disclosed in EP-A 686 662, herein incorporated by reference.

According to a sixth embodiment of the method for preparing a conductive layer, according to the present invention, the method further comprises wetting the conductive layer with an aprotic liquid with a dielectric constant greater than 15 prior, for example, N-methyl-pyrrolidinone, 1,3-dimethyl-2-imidazolidinone, 2-pyrrolidinone, N,N, N'N'-tetramethylurea, formamide, tetramethylsulphonea and N,N-dimethylacetamide, to tempering at a temperature of less than 100° C., as disclosed in EP-A 1 003 179, herein incorporated by reference.

According to a seventh embodiment of the method for preparing a conductive layer, according to the present invention, the wetting agent used for wetting the conductive layer is selected from the group consisting of 1,2-propandiol, propylene glycol, diethylene glycol, N-methyl pyrrolidinone, N,N-dimethylformamide, N-methylacetamide, N,N-dimethylacetamide, glycerol, hexylene glycol and sorbitol.

Conductive Coating

The antistatic and electroconductive layers according to the present invention are prepared according to the method for preparing a conductive layer according to the present invention.

According to a first embodiment of the electroconductive layer, according to the present invention, the electroconductive layer has a surface resistivity ≦800 ohm/square.

According to a second embodiment of the electroconductive layer, according to the present invention, the electroconductive layer has a surface resistivity <500 ohm/square.

According to a third embodiment of the electroconductive layer, according to the present invention, the electroconductive layer has a surface resistivity <300 ohm/square.

Printing Ink or Paste

According to the present invention a printing ink or paste is provided comprising an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder.

According to a first embodiment of the printing ink or paste according to the present invention, the printing ink or paste is a lithographic printing ink, a gravure printing ink, a flexographic printing ink, a silk screen printing ink, an ink-jet printing ink or an offset printing ink. The suitability of an aqueous composition according to the present invention for a particular printing process is substantially determined by the viscosity of the aqueous composition.

Lithographic inks have a viscosity under printing conditions which varies from about 15 Pa.s to 35 Pa.s depending on the ink formulation, drying mechanism, printing machine and speed of printing.

Gravure and flexographic inks vary greatly, depending on whether one considers the viscosity of the inks in the can or the diluted inks on the printing press. In addition, dye-based inks tend to be of lower viscosity than pigmented inks, owing to pigment settling problems both in the can and on the printing press. As a general guide, a typical press-ink viscosity while being printed would be around 15 mPa.s.

Silk screen printing inks depend on the type of ink, screen mesh and printing speed. Typical viscosities of the diluted ink while being printed from the screen are between 0.5 and 5 Pa.s for rapid processing (shear rate=ca. 100 $s^{-1}$) and 8 to 50 Pa.s for slow processing (shear rate=ca. 1 $s^{-1}$) and 50 to 800 Pa.s at rest (shear rate=ca. $10^{-2}$ $s^{-1}$).

Ink-jet inks have viscosities under printing conditions which vary from about 2 mPa.s to 20 mPa.s depending on the type of ink-jet process, nozzle construction, printing speed, ink-drying mechanism and print quality required.

Layers of the pastes exhibit excellent adhesion to phosphor layers, polyacrylate subbing layers, polycarbonate and polyesters e.g. poly(ethylene terephthalate) and surface resistances ≦1000 Ω/square at visual light transmissions >75%, with ≧85% being obtainable.

Printing Process

The present invention provides a printing process comprising the steps of: providing a printing ink or paste according to the present invention; printing the printing ink or paste on an optionally subbed support, a dielectric layer, a phosphor layer or an optionally transparent conductive layer.

According to a first embodiment of the printing process, according to the present invention, the support is paper, polymer film, glass or ceramic.

Among the electroluminescent phosphors to which the printing ink or paste can be applied are II–VI semiconductors e.g. ZnS, or are a combination of group II elements with oxidic anions, the most common being silicates, phosphates, carbonates, germanates, stannates, borates, vanadates, tungstates and oxysulphates. Typical dopants are metals and all the rare earths e.g. Cu, Ag, Mn, Eu, Sm, Tb and Ce. The electroluminescent phosphor may be encapsulated with a transparent barrier layer, e.g. $Al_2O_3$ and AlN, against moisture. Such phosphors are available from Sylvania, Shinetsu polymer KK, Durel, Acheson and Toshiba. An example of coatings with such phosphors is 72x, available from Sylvania/GTE, and coatings disclosed in U.S. Pat. No. 4,855,189. Suitable electroluminescent phosphors are ZnS doped with manganese, copper or terbium, $CaGa_2S_4$ doped with cerium, electroluminescent phosphor pastes supplied by DuPont e.g.: LUXPRINT® type 7138J, a white phosphor; LUXPRINT® type 7151J, a green-blue phosphor; and LUXPRINT® type 7174J, a yellow-green phosphor; and ELECTRODAG® EL-035A supplied by Acheson. A particularly preferred electroluminescent phosphor is a zinc sulphide phosphor doped with manganese and encapsulated with AlN.

Any dielectric material may be used, with yttria and barium titanate being preferred e.g. the barium titanate paste LUXPRINT® type 7153E high K dielectric insulator supplied by DuPont and the barium titanate paste ELECTRODAG® EL-040 supplied by Acheson.

According to a second embodiment of the printing process, according to the present invention, the printing process comprises the steps of: providing a printing ink or paste according to the present invention; printing the printing ink or paste on an optionally subbed support, a dielectric layer, a phosphor layer or an optionally transparent conductive layer.

According to a third embodiment of the printing process according to the present invention, the printing process is a process for producing an electroluminescent device comprising the steps of: (i) printing a transparent or translucent support with a printing ink or paste according to the present invention to produce the transparent or translucent first conductive layer; (ii) printing the first conductive layer with a layer comprising an electroluminescent phosphor; (iii) optionally printing the layer comprising an electroluminescent phosphor with a dielectric layer; and (iv) printing the dielectric layer if present, or the layer comprising the electroluminescent phosphor if no dielectric layer is present, with a solution, dispersion or paste comprising a polymer or copolymer of a 3,4-dialkoxythiophene to produce the second conductive layer, wherein the polymer or copolymer of the 3,4-dialkoxythiophene in the solution, dispersion or paste used in step (i) may be the same or different from the polymer or copolymer of the (3,4-dialkoxythiophene) used in the solution, dispersion or paste used in step (iv).

According to a fourth embodiment of the printing process according to the present invention, the printing process is a process for producing an electroluminescent device comprising the steps of: (i) printing a support with a printing ink or paste according to the present invention to produce the second conductive layer; (ii) optionally printing the second conductive layer with a dielectric layer; (iii) printing the dielectric layer if present, or the second conductive layer if no dielectric layer is present, with a layer comprising an electroluminescent phosphor; and (iv) printing the electroluminescent phosphor layer with a transparent solution, dispersion or paste comprising a polymer or copolymer of a 3,4-dialkoxythiophene to produce the transparent or translucent first conductive layer, wherein the polymer or copolymer of a 3,4-dialkoxythiophene in the solution, dispersion or paste used in step (i) may be the same or different from the polymer or copolymer of a 3,4-dialkoxythiophene in the transparent solution, dispersion or paste used in step (iv).

Coating Process

Aspects of the present invention realized by a coating process comprising the steps of: providing an aqueous composition, according to the present invention; coating the aqueous composition on an optionally subbed support, a dielectric layer, a phosphor layer or an optionally transparent conductive layer.

Transparent or Translucent Support

According to a first embodiment of the coating process or fifth embodiment of the printing process, according to the present invention, the support is paper, polymer film, glass or ceramic.

According to a second embodiment of the coating process or a sixth embodiment of the printing process, according to the present invention, the support is a transparent or translucent polymer film.

A transparent or translucent support suitable for use with the electoconductive or antistatic layers, according to the present invention, may be rigid or flexible and consist of a glass, a glass-polymer laminate, a polymer laminate, a thermoplastic polymer or a duroplastic polymer. Examples of thin flexible supports are those made of a cellulose ester, cellulose triacetate, polypropylene, polycarbonate or polyester, with poly(ethylene terephthalate) or poly(ethylene naphthalene-1,4-dicarboxylate) being particularly preferred.

INDUSTRIAL APPLICATION

The aqueous composition according to the present invention can, for example, be used to apply antistatic or electroconductive layers to an optionally subbed support, a dielectric layer, a phosphor layer or an optionally transparent conductive layer.

The printing ink or paste according to the present invention can, for example, be used to apply antistatic or electroconductive patterns to an optionally subbed support, a dielectric layer, a phosphor layer or an optionally transparent conductive layer. This can, for example, be a step in the production of electroluminescent devices which can be used in lamps, displays, back-lights e.g. LCD, automobile dashboard and keyswitch backlighting, emergency lighting, cellular phones, personal digital assistants, home electronics, indicator lamps and other applications in which light emission is required.

The invention is illustrated hereinafter by way of comparative examples and invention examples. The percentages and ratios given in these examples are by weight unless otherwise indicated. The COMPARATIVE and INVENTION EXAMPLES illustrating the present invention used the following layers:

a layer of LUXPRINT™ 7153E (a high K dielectric insulator) silk screen printed through a P55 screen;

a layer of LUXPRINT™ 7138J (a white phosphor) silk screen printed through a P55 screen.

and the supports given in Table 2.

TABLE 2

| Support nr. | polymer foil | Subbing layer nr. |
|---|---|---|
| 01 | PET | 01 |
| 02 | PET | 02 |
| 03 | PET | 03 |
| 04 | PET | 04 |
| 05** | PET | 05** |
| 06 | Polycarbonate | 06 |

**Autotype ™ V200

Subbing layer Nr. 01 has the composition:

| | |
|---|---|
| Copolymer of 50 mol % ethylene glycol, 26.5 mol % terephthalic acid, 20 mol % isophthalic acid, 3.5 mol % sulphoisophthalic acid | 79.8% |
| Kieselsol ™ 100F, a silica from BAYER | 19.9% |
| Arkopon ™ T, a surfactant from Clariant | 0.3% |

Subbing layer Nr. 02 has the composition:

| | |
|---|---|
| copolymer of 88% vinylidene chloride, 10% methyl acrylate and 2% itaconic acid | 79.1% |
| Kieselsol ® 100F, a colloidal silica from BAYER | 18.6% |
| Mersolat ® H, a surfactant from BAYER | 0.4% |
| Ultravon ® W, a surfactant from CIBA-GEIGY | 1.9% |

Subbing layer Nr. 03 has the composition:

| | |
|---|---|
| copolymer of 50 mol % ethylene glycol, 26.5 mol % terephthalic acid, 20 mol % isophthalic acid, 3.45 mol % sulfoisophthalic acid and 0.05 mol % of | 77.2% |

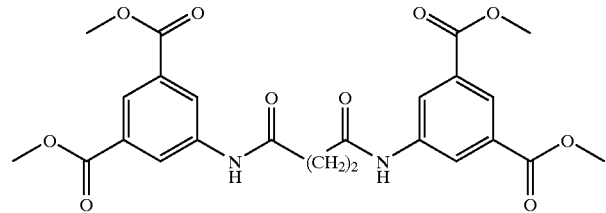

| | |
|---|---|
| copolymer of 20% ethyl acrylate and 80% methacrylic acid | 5.8% |
| Hordamer ® PE02, aqueous dispersion of polyethylene from HOECHST | 2.4% |
| PAREZ RESIN ® 707, a melamine-formaldehyde resin from AMERICAN CYANAMID | 14.6% |

Subbing layer Nr. 04 has the composition:

| | |
|---|---|
| Copolymer of 50 mol % ethylene glycol, 26.5 mol % terephthalic acid, 20 mol % isophthalic acid, 3.5 mol % sulfoisophthalic acid | 79.8% |
| Kieselsol 100F, a colloidal silica from BAYER | 19.9% |
| Arkopon ® T, a surfactant from Clariant | 0.3% | coated with:

| | |
|---|---|
| Laponite ® RD (magnesium silicate) | 13.88% |
| Gelatin | 24.91% |
| Bronidox ®, a bacterocide | 0.35% |
| acylated Ultravon ® W, a surfactant from Ciba Geigy | 1.42% |
| Arkopal ® N60, a surfactant from Clariant | 0.72% |
| Trimethylolpropane | 13.35% |
| Kieselsol ® 500, a colloidal silica from BAYER | 41.63% |
| Perapret PE40, a polyethylene latex from BASF | 2.67% |
| Poly(methyl methacrylate) matting agent | 1.07% |

The starting material for the preparation of the PEDOT pastes described in the INVENTION EXAMPLES was a 1.2% by weight aqueous dispersion of PEDOT/PSS containing a weight ratio PEDOT to PSS of 1:2.4 prepared as disclosed in EP-A 440 957 and having a typical viscosity measured using an AR1000 plate and cone rheometer (diameter 4 cm; cone angle 2°) at 20° C. of 38 mPa.s at a shear rate of 5 $s^{-1}$ decreasing to 33.5 mPa.s at a shear rate of 35 mPa.s and has a typical pH of 1.9.

INVENTION EXAMPLES 1 to 12

Preparation of PEDOT Paste 01

The PEDOT [poly(3,4-ethylenedioxythiophene)] paste 01, a transparent PEDOT paste, was produced at 25° C. by carefully adding to 100 g of a 1.2% by weight dispersion of PEDOT/PSS in water at 800 rpm in a dissolver, 1 g of CARBOPOL® ETD-2623, 15 g of diethylene glycol, 10 g of n-propanol and finally after 1 hour of stirring the speed was increased to 1200 rpm and sufficient of a 25% solution of ammonia in water (ca. 0.5 ml) added to adjust the pH to a value of 5 followed by stirring for a further 5 minutes.

The PEDOT paste 01 had a viscosity at 25° C. of 13 Pa.s at a shear rate of 10 $s^{-1}$, as measured using an AR100 plate and cone rheometer (diameter 4 cm; cone angle 2°). The recipe for preparing PEDOT paste 01 and the properties of a print printed with a P79 mesh screen on an AUTOSTAT® CT7 with an manual press followed by drying at 110° C. for 5 minutes are summarized in Table 3.

The optical density of the print was determined using a MacBeth™ TR924 densitometer in transmission with a visible filter. The surface resistance of the print was measured by contacting the printed layer with parallel copper electrodes each 35 mm long and 35 mm apart capable of forming line contacts, the electrodes being separated by a TEFLON® insulator. This enabled a direct measurement of the surface resistance per square to be realized. The optical density and surface resistance of the prints produced with PEDOT paste 01 are also given in Table 3.

TABLE 3

|  | PEDOT paste 01 |
| --- | --- |
| 1.2% dispersion of PEDOT/PSS [g] | 100 |
| CARBOPOL ™ ETD 2623 [g] | 1.0 |
| diethylene glycol [g] | 15 |
| n-propanol [g] | 10 |
| ammonia (25% in water) to pH of 5 | |
| surface resistance [Ω/square] | 800 |
| optical density (white light) | 0.06 |

Preparation of PEDOT Paste 02

PEDOT paste 02; an opaque PEDOT paste, was produced at 25° C. by carefully adding to 100 g of a 1.2% by weight dispersion of PEDOT/PSS in water at 800 rpm in a dissolver, 1 g of CARBOPOL® ETD-2623, 15 g of diethylene glycol, 10 g of n-propanol, 3.6 g of LEVANYL™ A-SF, a black pigment from BAYER, and finally after 1 hour of stirring the speed was increased to 1200 rpm and sufficient of a 25% solution of ammonia in water (ca. 0.5 ml) added to adjust the pH to a value of 5 followed by stirring for a further 5 minutes.

The recipe for preparing PEDOT paste 02 and the properties of a print printed with a P79 mesh screen followed by drying at 110° C. for 5 minutes with an manual press are summarized in Table 4.

The PEDOT paste 02 had a viscosity at 25° C. of 13 Pa.s at a shear rate of 10 s$^{-1}$, as determined for PEDOT paste 01. Screen printing with a P79 mesh followed by drying at 130° C. for 2 minutes produced a layer with a surface resistance of 700 Ω/square and an optical density of 0.50, as determined for PEDOT paste 01.

TABLE 4

|  | PEDOT paste 02 |
| --- | --- |
| 1.2% dispersion of PEDOT/PSS [g] | 100 |
| CARBOPOL ™ ETD 2623 [g] | 1.0 |
| diethylene glycol [g] | 15 |
| n-propanol [g] | 10 |
| LEVANYL ™ A-SF [g] | 3.6 |
| ammonia (25% in water) to pH of 5 | |

Preparation of Electroluminescent Devices

INVENTION EXAMPLES 1 to 6 were prepared by screen printing through a P79 mesh screen onto support nrs 1 to 6 with layer configuration 1 i.e.:

a layer of the DuPont LUXPRINT® type 7145L rear electrode, silver conductor (resistance of 1 ohm/square), was first applied forming a busbar for the first electrode;

a layer of paste 01 to a thickness after drying of 200 to 300 nm was then applied thereby forming the first (transparent) electrode;

followed by a layer of LUXPRINT™ 7151J, a zinc sulfide phosphor dispersion from DuPont, to a thickness after drying of 20 μm;

then applying 3 layers of the DuPont LUXPRINT® type 7153E, high K dielectric insulator ink barium titanate), with drying between each application each having a thickness after drying of ca. 7 μm;

then applying a layer of DuPont LUXPRINT® type 7144E ink, a carbon conductor ink (resistance of 80 ohm/square), to a thickness after drying of ca. 8 μm as a back electrode; and finally a layer of the DuPont LUXPRINT® type 7145L rear electrode, silver conductor (resistance of 1 ohm/square), over sufficient of the surface of the back conductive layer to form a bus bar for the rear electrode.

Layer configuration 2 as used in the devices of INVENTION EXAMPLE 7 to 12 only differed from that used for the devices of INVENTION EXAMPLES 1 to 6 in the replacement of the layer of DuPont LUXPRINT® type 7144E ink by a layer of PEDOT paste 02 (surface resistance of 700 Ω/square) with a dry thickness of ca. 0.2 μm, which was dried at 120° C. for 2 minutes forming the second PEDOT-containing electrode according to the present invention.

Evaluation of the Electroluminescent Devices

The performance of the electroluminescent devices of INVENTION EXAMPLES 1 to 12 were evaluated by monitoring the emission of the devices with a United Detector Technology Serial #67146 silicon photo-multiplier in contact with the non-coated side of the support electro AC voltage of 100V at 400 Hz was applied to the luminescent devices in a conditioning chamber having a temperature of 60° C. and a relative humidity of 90% and the resistance of the device to which a voltage had been applied monitored with respect to the resistance of an identical device to which no voltage had been applied. The initial emission in cd/m$^2$ and the initial resistance is given in Table 5.

TABLE 5

| Invention Example nr | Layer configuration | support nr. | Initial emission [cd/m$^2$] | Initial resistance [Ω] |
| --- | --- | --- | --- | --- |
| 1 | 1 | 01 | 34 | 914 |
| 2 | 1 | 02 | 33 | 840 |
| 3 | 1 | 03 | 32 | 776 |
| 4 | 1 | 04 | 32 | 867 |
| 5 | 1 | 05 | 30 | 802 |
| 6 | 1 | 06 | 29 | 896 |
| 7 | 2 | 01 | 29 | 774 |
| 8 | 2 | 02 | 30 | 781 |
| 9 | 2 | 03 | 29 | 736 |
| 10 | 2 | 04 | 28 | 844 |
| 11 | 2 | 05 | 29 | 715 |
| 12 | 2 | 06 | 28 | — |

INVENTION EXAMPLES 13 to 18

INVENTION EXAMPLES 13 to 18 were prepared by screen printing through a P79 mesh screen onto support nrs 1 to 6 with layer configuration 3 i.e.:

a layer of the DuPont LUXPRINT® type 7145L rear electrode, silver conductor (resistance of 1 Ω/square), was first applied forming a busbar for the "second" electrode;

a layer of PEDOT paste 02 was then applied to the silver-coated support to a thickness after drying at 130°

C. for 2 minutes of 200 to 500 nm thereby forming the "second PEDOT-containing electrode," according to the present invention; then 3 layers of the DuPont LUXPRINT® type 7153E, high K dielectric insulator ink (barium titanate), were applied with drying between each application each having a thickness after drying of ca. 7 μm;

then a layer of LUXPRINT® 7151J, a zinc sulfide phosphor dispersion from DuPont, was applied to a thickness after drying of ca. 10 μm;

a layer of PEDOT paste 01 (surface resistance of 800 Ω/square) was applied which upon drying at 90° C. had a thickness of ca. 0.2 μm forming the first PEDOT-containing electrode" according to the present invention and finally a layer of the DuPont LUXPRINT® type 7145L rear electrode, silver conductor (resistance=1 Ω/square), to sufficient of the second electrode surface to form a bus bar therefor.

Evaluation of the Electroluminescent Devices

The performance of the electroluminescent devices of INVENTION EXAMPLES 13 to 18 were evaluated as described for INVENTION EXAMPLES 1 to 12. The results are given in Table 6.

TABLE 6

| Invention Example nr | Layer configuration | support nr. | Initial emission [cd/m²] | Initial resistance [Ω] |
|---|---|---|---|---|
| 13 | 3 | 01 | 39 | — |
| 14 | 3 | 02 | 37 | — |
| 15 | 3 | 03 | 39 | — |
| 16 | 3 | 04 | 38 | — |
| 17 | 3 | 05 | 40 | — |
| 18 | 3 | 06 | 42 | — |

INVENTION EXAMPLE 19

Preparation of Opaque PEDOT Paste 03

PEDOT paste 03, an opaque PEDOT paste, was produced at 25° C. by carefully adding to 100 g of a 1.2% by weight dispersion of PEDOT/PSS in water at 800 rpm in a dissolver, 1 g of CARBOPOL® ETD 2623, 15 g of diethylene glycol, 10 g of n-propanol, 1.92 g of LEVANYL™ A-SF, a black pigment from BAYER, 0.16 g of ZONYL™ FSO100, and finally after 1 hour of stirring the speed was increased to 1200 rpm and sufficient of a 25% solution of ammonia in water (ca. 0.5 ml) added to adjust the pH to a value of 4.2 followed by stirring for a further 5 minutes. The recipe for PEDOT paste 03 together with that for PEDOT paste 02 is given in Table 7.

TABLE 7

|  | PEDOT paste 02 | PEDOT paste 03 |
|---|---|---|
| 1.2% dispersion of PEDOT/PSS [g] | 100 | 100 |
| CARBOPOL ™ ETD 2623 [g] | 1.0 | 2.0 |
| diethylene glycol [g] | 15 | 15 |
| n-propanol [g] | 10 | 10 |
| Levanyl ™ A-SF [g] | 3.6 | 1.92 |
| ZONYL ™ FSO100 [g] | — | 0.16 |
| ammonia (25% in water) | 0.52 (pH = 5) | (pH = 4.2) |

The viscosity of PEDOT Paste 03 at 20° C. in the shear rate range of 0.1 to 1000 s$^{-1}$ determined using an AR1000 plate and cone rheometer (diameter 4 cm; cone angle 20°) are given in Table 8.

TABLE 8

| Shear rate [s$^{-1}$] | Viscosity [Pa.s] | Shear rate [s$^{-1}$] | Viscosity [Pa.s] |
|---|---|---|---|
| 0.16 | 739 | 15.85 | 15.6 |
| 0.25 | 517 | 25.12 | 11.2 |
| 0.40 | 350 | 39.81 | 7.95 |
| 0.63 | 234 | 63.10 | 5.69 |
| 1.00 | 159 | 100 | 4.17 |
| 1.59 | 101 | 158.50 | 3.01 |
| 2.51 | 69.5 | 251.20 | 2.24 |
| 3.98 | 47.5 | 398.10 | 1.64 |
| 6.31 | 33.2 | 631.00 | 1.25 |
| 10.0 | 22.4 | 1000 | 0.95 |

The compositions of prints printed with a manual press with P48 mesh and P79 screens followed by drying at 110° C. for 5 minutes are given in Table 9 for PEDOT paste 03 together with those for PEDOT paste 02. The properties of the prints with PEDOT paste 03 printed with a P48 screen are also given in Table 9.

TABLE 9

|  | PEDOT paste 02 | | PEDOT paste 03 | | |
|---|---|---|---|---|---|
|  | P48 | P79 | P48 | P79 | P120 |
| PEDOT/PSS [mg/m²] | 443 | 277 | 443 | 277 | — |
| CARBOPOL ™ ETD 2623 [mg/m²] | 379 | 237 | 759 | 474 | — |
| Levanyl ™ A-SF [mg/m²] | 382 | 239 | 204 | 127 | — |
| ZONYL ™ FSO100 [mg/m²] | — | — | 61 | 38 | — |
| surface resistance [Ω/square] | — | 700 | 600 | 830 | 1400 |
| optical density (vis) | — | 0.50 | 0.80 | 0.58 | 0.44 |

INVENTION EXAMPLE 20

Preparation of Transparent PEDOT Pastes 04 to 07

PEDOT [poly(3,4-ethylenedioxythiophene)] pastes 04 to 07, transparent PEDOT pastes, were produced at 25° C. by carefully adding to 100 g of a 1.2% by weight dispersion of PEDOT/PSS in water at 800 rpm in a dissolver, the appropriate quantities of CARBOPOL® ETD 2623, diethylene glycol, n-propanol, ZONYL™ FSO100 and deionized water, where applicable, as given for the different pastes in Table 10. After 1 hour of stirring the speed was increased to 1200 rpm and the pH measured.

The PEDOT pastes 04 to 07 had viscosities of about 40 Pa.s at 25° C. and a shear rate of 1 s$^{-1}$. Prints were produced with PEDOT pastes 04 to 07 with a P79 mesh screen on an AUTOSTAT® CT07 support with a manual press followed by drying at 110° C. for 5 minutes and the surface resistances and optical densities of layers evaluated as for INVENTION EXAMPLES 1 to 12. The results are given in Table 10 together with those with PEDOT paste 01.

TABLE 10

|  | PEDOT paste 01 | PEDOT paste 04 | PEDOT paste 05 | PEDOT paste 06 | PEDOT paste 07 |
|---|---|---|---|---|---|
| 1.2% aq. dispersion of PEDOT/PSS [g] | 100 | 100 | 100 | 100 | 100 |
| CARBOPOL ™ ETD 2623 [g] | 1.0 | 1.0 | 2.0 | 3.2 | 1.44 |
| diethylene glycol [g] | 15 | 97 | 194 | 311 | 128.6 |
| n-propanol [g] | 10 | 10 | 20 | 32 | 57.2 |
| ZONYL ™ FSO100 [g] | — | 0.21 | 0.42 | 0.67 | 0.029 |
| ammonium hydroxide [g] | 0.5 (pH = 5) | (pH = 7) | (pH = 6) | (pH = 6) | (pH = 6) |
| deionized water | — | — | 100 | 233.3 | — |
| Printed through a P79 screen |  |  |  |  |  |
| PEDOT/PSS [mg/m$^2$] | 285 | 173 | 86 | 52 |  |
| CARBOPOL ™ ETD 2623 [mg/m$^2$] | 237 | 144 | 144 | 144 |  |
| ZONYL ™ FSO100 [mg/m$^2$] | — | 29 | 29 | 29 |  |
| Printed through a P48 screen |  |  |  |  |  |
| PEDOT/PSS [mg/m$^2$] | 455 | 277 | 138 | 83 |  |
| CARBOPOL ™ ETD 2623 [mg/m$^2$] | 379 | 231 | 231 | 231 |  |
| ZONYL ™ FSO100 [mg/m$^2$] | — | 46 | 46 | 46 |  |

The viscosities of PEDOT Paste 04 and PEDOT Paste 05 as a function of shear rate measured as for PEDOT Paste 03 are given in Table 11.

TABLE 11

| Shear rate [s$^{-1}$] | Viscosity [Pa · s] at 20° C. PEDOT paste 04 | Viscosity [Pa · s] at 20° C. PEDOT paste 05 | Shear rate [s$^{-1}$] | Viscosity [Pa · s] at 20° C. PEDOT paste 04 | Viscosity [Pa · s] at 20° C. PEDOT paste 05 |
|---|---|---|---|---|---|
| 0.10 | 185.0 | 216.3 | 15.85 | 4.17 | 4.80 |
| 0.16 | 127.5 | 144.3 | 25.12 | 3.13 | 3.57 |
| 0.25 | 89.2 | 98.6 | 39.81 | 2.29 | 2.75 |
| 0.40 | 62.4 | 68.5 | 63.10 | 1.71 | 2.07 |
| 0.63 | 42.9 | 48.6 | 100 | 1.30 | 1.54 |
| 1.00 | 30.5 | 34.5 | 158.50 | 0.968 | 1.20 |
| 1.59 | 21.3 | 23.8 | 251.20 | 0.737 | 0.938 |
| 2.51 | 15.2 | 16.9 | 398.10 | 0.553 | 0.737 |
| 3.98 | 11.0 | 11.6 | 631.00 | 0.438 | 0.588 |
| 6.31 | 8.08 | 9.07 | 1000 | 0.355 | 0.481 |
| 10.0 | 5.83 | 6.50 |  |  |  |

Print Quality of Prints

Prints were produced with P48, P79 and P120 mesh screens as indicated in Table 12 on a AUTOSTAT® CT07 support and a LUXPRINT® 7153 standard layer with a manual press followed by drying at 110° C. for 5 minutes. The quality of the prints was visually assessed using three descriptions:

poor wetting = obviously poor wetting;
flecks = observation of flecks;
acceptable = wetting apparently good.

The results are given in Table 12.

TABLE 12

|  | Screen type | Print quality on AUTOSTAT CT7 | Print quality on LUXPRINT ® 7153E |
|---|---|---|---|
| PEDOT paste 01 | P48 | poor wetting | poor wetting |
|  | P79 | poor wetting | poor wetting |
|  | P120 | poor wetting | poor wetting |
| PEDOT paste 04 | P48 | flecks/acceptable | flecks/poor wetting |
|  | P79 | acceptable | flecks/acceptable |
|  | P120 | acceptable | flecks/acceptable |
| PEDOT paste 05 | P48 | flecks/acceptable | acceptable |
|  | P79 | flecks/acceptable | acceptable |
|  | P120 | acceptable | acceptable |
| PEDOT paste 07 | P48 | flecks/acceptable | acceptable |
|  | P79 | acceptable | acceptable |
|  | P120 | acceptable | acceptable |

Poor wetting was exhibited with PEDOT paste 01 upon printing on the AUTOSTAT® CT07 support and the LUXPRINT® 7153 standard layer with a manual press with P48, P79 and P120 mesh screens.

The wetting was visually good upon printing with PEDOT pastes 04, 05 and 07 on the AUTOSTAT® CT07 support with a manual press with P48, P79 and P120 mesh screens. In the case of printing on the LUXPRINT® 7153 standard layer good wetting was observed with PEDOT pastes 05 and 07 with P48, P79 and P120 screens, whereas in the case of PEDOT paste 04 good wetting was only observed with P79 and P120 screens.

In general the print quality improved as the concentration of CARBOPOL™ ETD 2623 in the conductive layer increased.

Adhesion of Prints

The adhesion of the prints on a AUTOSTAT® CT07 support and a LUXPRINT® 7153 layer was determined by a tape test: first scratching the layer cross-wise with a razor blade over an area of ca. 4×10 cm$^2$, applying a 10×24 cm$^2$ piece of TESAPACK® 4122 brown tape, pressing by rubbing with a hard object and finally removing the tape from one end in a single movement in an upward direction. The adhesion of the printed layers was determined visually on a scale of 0 to 5, 0 corresponding to no removal of the layer with the tape, according to the following criteria:

| | |
|---|---|
| adhesion assessment of 0: | no removal of the layer with the tape; |
| adhesion assessment of 1: | removal of an area equal to 25% of the area of the tape with the tape; |
| adhesion assessment of 2: | removal of an area equal to 50% of the area of the tape with the tape; |
| adhesion assessment of 3: | removal of an area equal to 75% of the area of the tape with the tape; |

-continued

| | |
|---|---|
| adhesion assessment of 4: | removal of an area equal to the area of the tape with the tape; |
| adhesion assessment of 5: | removal of an area greater than the area of the tape with the tape. |

Intermediate assessments such as 0/1, 1/2, 2/3 and 3/4 were also possible. The results are given in Table 13.

TABLE 13

| | Screen type | Adhesion on AUTOSTAT CT7 | Adhesion on LUXPRINT ® 7153E |
|---|---|---|---|
| PEDOT paste 01 | P48 | 3/4 | 3/4 |
| | P79 | 3/4 | 3/4 |
| | P120 | 3/4 | 0/1 |
| PEDOT paste 04 | P48 | 0/1 | 0/1 |
| | P79 | 0/1 | 0/1 |
| | P120 | 0/1 | 0/1 |
| PEDOT paste 05 | P48 | 0/1 | 0/1 |
| | P79 | 0/1 | 0/1 |
| | P120 | 0/1 | 0/1 |
| PEDOT paste 07 | P48 | 0/1 | 0/1 |
| | P79 | 0/1 | 0/1 |
| | P120 | 0/1 | 0/1 |

In the case of PEDOT paste 01, an acceptable adhesion [=0/1] was only observed on LUXPRINT® 7153 standard layer with a manual press with a P120 mesh screen.

An adhesion of 0/1 was observed for prints of PEDOT pastes 04, 05 and 07 produced with a manual press with P48, P79 and P120 mesh screens on both the AUTOSTAT® CT07 support and on the LUXPRINT® 7153 standard layer.

Thus acceptable adhesion was obtained at CARBOPOL™ ETD 2623 concentration in the layer at or above about 50% by weight.

Surface Resistance of Prints

The surface resistance of the prints on the AUTOSTAT® CT7 support and on the LUXPRINT® 7153 standard layer were evaluated as for INVENTION EXAMPLES 1 to 12. The drying conditions were found to have no influence on the surface resistances measured for the prints. The optical density of the prints was determined by dividing by ten the optical density measured in transmission of 10 strips using a MacBeth™ TR924 densitometer with a visible filter. The results are given in Table 14.

TABLE 14

| | Screen type | Surface resistivity [ohm/square] on AUTOSTAT CT7 | OD(vis) vs AUTOSTAT CT7 | Surface resistivity [ohm/square] on LUXPRINT ® 7153E |
|---|---|---|---|---|
| PEDOT paste 01 | P48 | 550 | 0.08 | 700 |
| | P79 | 700; 800 | 0.06 | 1300 |
| | P120 | 1600 | 0.03 | 5000 |
| PEDOT paste 04 | P48 | 1200 | 0.04 | 2500 |
| | P79 | 1900 | 0.03 | 3800 |
| | P120 | 2700 | 0.02 | 3900 |
| PEDOT paste 05 | P48 | 2500 | 0.02 | 5000 |
| | P79 | 3500 | 0.02 | 6000 |
| | P120 | 5500 | 0.01 | 12000 |
| PEDOT paste 07 | P48 | 5500 | — | 10000 |
| | P79 | 17000 | — | 40000 |
| | P120 | 19000 | — | 80000 |

The surface resistance of prints produced with PEDOT pastes 01, 04, 05 and 07 increased as the concentration of PEDOT in the prints at a given layer thickness, as determined by the screen used, decreased.

INVENTION EXAMPLE 21

Coloured transparent PEDOT pastes 08 and 09 were produced from PEDOT paste 01 by adding copper phthalocyanine and rhodamine 6G in quantities equal to and half of that of PEDOT/PSS respectively. The compositions of the layers produced by screen printing PEDOT pastes 08 and 09 with a manual press through P48 and P120 mesh screens on an AUTOSTAT® CT7 support are given in Table 15 together with the colour of the prints, the optical densities of the prints as determined in transmission with a MacBeth™ TR924 densitometer with visible, red, blue and green filters and the surface resistances of the prints determined as described for INVENTION EXAMPLES 1 to 12.

These results demonstrated that coloured printing inks and pastes with similar surface resistances to printing inks without added colorants can be produced according to the present invention.

TABLE 15

| | Paste 01 printed through a P79 mesh screen | Paste 08 printed through P48 mesh screen | Paste 09 printed through P48 mesh screen | Paste 09 printed through a P120 mesh screen |
|---|---|---|---|---|
| PEDOT/PSS [m²/g] | 285 | 500 | 500 | 200 |
| copper phthalocyanine [m²/g] | — | 500 | — | — |
| Rhodamine 6G [m²/g] | — | — | 250 | 100 |
| CARBOPOL ™ ETD 2623 [m²/g] | 237 | 417 | 417 | 167 |
| surface resistance [ohm/square] | 800 | 500 | 450 | 950 |

TABLE 15-continued

|  | Paste 01 printed through a P79 mesh screen | Paste 08 printed through a P48 mesh screen | Paste 09 printed through a P48 mesh screen | Paste 09 printed through a P120 mesh screen |
| --- | --- | --- | --- | --- |
| Colour | colourless | cyan | magenta | magenta |
| $D_{vis}$ | 0.06 | 0.14 | 1.07 | 0.19 |
| $D_{red}$ | — | 0.69 | 0.13 | 0.08 |
| $D_{green}$ | — | 0.22 | 1.07 | 0.65 |
| $D_{blue}$ | — | 0.12 | 0.27 | 0.17 |

INVENTION EXAMPLE 22

Transparent PEDOT pastes 10, 11 and 12 were produced as for PEDOT paste 04 (see INVENTION EXAMPLE 20) except that the 0,2 g of ZONYL™ FSO100 was replaced by the quantities of ZONYL™ FSA, ZONYL™ FSE and ZONYL™ FSP given in Table 16 for the respective PEDOT pastes to ensure that the active quantity of ZONYL™ surfactant was identical in each case. The compositions of PEDOT pastes 4, 10, 11 and 12 together with that of PEDOT paste 04 are given in Table 16.

TABLE 16

|  | PEDOT paste 04 | PEDOT paste 10 | PEDOT paste 11 | PEDOT paste 12 |
| --- | --- | --- | --- | --- |
| 1.2% aq. disp. of PEDOT/PSS [g] | 100 | 100 | 100 | 100 |
| CARBOPOL ™ ETD 2623 [g] | 1.0 | 1.0 | 1.0 | 1.0 |
| diethylene glycol [g] | 97 | 97 | 97 | 97 |
| n-propanol [g] | 10 | 10 | 10 | 10 |
| ZONYL ™ FSO100 [g] (100% active) | 0.2 | — | — | — |
| ZONYL ™ FSA [g] (25% active) | — | 0.8 | — | — |
| ZONYL ™ FSE [g] (14% active) | — | — | 1.45 | — |
| ZONYL ™ FSP [g] (35% active) | — | — | — | 0.55 |
| pH | 7 | 7 | 7 | 7 |

The compositions of the layers produced by screen printing PEDOT pastes 04, 10, 11 and 12 with a manual press through a P48 mesh screen and drying at 110° C. for 5 minutes are given in Table 17 together with the optical densities of the prints and the surface resistances of the prints determined as described for INVENTION EXAMPLES 1 to 12 and the adhesion determined as described for INVENTION EXAMPLE 20.

The mottle of the printed layers on the AUTOSTAT™ CT7 support and the standard layer of LUXPRINT™ 7153E was determined visually on a scale of 0 to 5, 0 corresponding to a good mottle-free layer, according to the following criteria:

Mottle assessment of 0: no mottle observed upon visual inspection;
Mottle assessment of 1: mottle over between 1 and 10% of print;
Mottle assessment of 2: Mottle over between 11 and 20% of print;
Mottle assessment of 3: Mottle over between 21 and 40% of print;
Mottle assessment of 4: Mottle over between 41 and 60% of print;
Mottle assessment of 5: Mottle over more than 60% of the print.

The results are also given in Table 17 below.

TABLE 17

| Printed through a P48 screen | PEDOT Paste 04 | PEDOT paste 10 | PEDOT paste 11 | PEDOT paste 12 |
| --- | --- | --- | --- | --- |
| PEDOT/PSS [mg/m$^2$] | 300 | 300 | 300 | 300 |
| CARBOPOL ™ ETD 2623 [mg/m$^2$] | 250 | 250 | 250 | 250 |
| ZONYL ™ FSO100 [mg/m$^2$] | 50 | — | — | — |
| ZONYL ™ ESA [mg/m$^2$] | — | 50 | — | — |
| ZONYL ™ FSE [mg/m$^2$] | — | — | 50 | — |
| ZONYL ™ FSP [mg/m$^2$] | — | — | — | 50 |
| Surface resistance [Ω/square] | 950 | 1150 | 910 | 780 |
| Optical density (white light) | 0.03 | 0.05 | 0.05 | 0.04 |
| Adhesion on AUTOSTAT ® CT7 support | 0/1 | — | 0/1 | 0/1 |
| Adhesion on LUXPRINT ® 7153E layer | 0/1 | 0/1 | 0/1 | 0/1 |
| Mottle on AUTOSTAT ® CT7 support | 4 | 3 | 3 | 3 |
| Mottle on LUXPRINT ® 7153E layer | 4 | 3 | 4 | 4 |

ZONYL™ PSO100 is a non-ionic surfactant and ZONYL™ FSA, ZONYL™ FSE and ZONYL™ FSP are all anionic surfactants. The results in Table 15 therefore show that both anionic and non-ionic surfactants can be used in the aqueous compositions, according to the present invention, to procedure acceptable electroconductive and antistatic layers, according to the present invention.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. An aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder, wherein said non-Newtonian binder is a polyacrylate binder.

2. A method for preparing a conductive layer comprising: applying an aqueous composition, containing a polymer or copolymer of a 3,4-dialkoxythiophene in which the two alkoxy groups may be the same or different or together represent an optionally substituted oxy-alkylene-oxy bridge, a polyanion and a non-Newtonian binder, to an optionally subbed support, a dielectric layer, a phosphor layer or an optionally transparent conductive coating; and drying the thereby applied aqueous composition, wherein said non-Newtonian binder is a polyacrylate.

3. An antistatic layer prepared according to a method for preparing a conductive layer comprising: applying an aqueous composition, containing a polymer or copolymer of a 3,4-dialkoxythiophene in which the two alkoxy groups may be the same or different or together represent an optionally substituted oxy-alkylene-oxy bridge, a polyanion and a non-Newtonian binder, said non-Newtonian binder being a polyacrylate, to an optionally subbed support, a dielectric layer, a phosphor layer or an optionally transparent conductive coating; and drying the thereby applied aqueous composition.

4. An electroconductive layer prepared according to a method for preparing a conductive layer comprising: applying an aqueous composition, containing a polymer or copolymer of a 3,4-dialkoxythiophene in which the two alkoxy groups may be the same or different or together represent an optionally substituted oxy-alkylene-oxy bridge, a polyanion and a non-Newtonian binder, said non-Newtonian binder being a polyacrylate, to an optionally subbed support, a dielectric layer, a phosphor layer or an optionally transparent conductive coating; and drying the thereby applied aqueous composition.

5. A printing ink or paste comprising an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder, wherein said non-Newtonian binder is a polyacrylate.

6. Printing ink or paste according to claim 5, wherein said printing ink or paste is a lithographic printing ink, a gravure printing ink, a flexographic printing ink, a silk screen printing ink, an ink-jet printing ink or an offset printing ink.

7. A printing process comprising: providing a printing ink or paste comprising an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder said non-Newtonian binder being a polyacrylate; printing said printing ink or paste on an optionally subbed support, a dielectric layer, a phosphor layer or an optionally transparent conductive coating.

8. An aqueous composition comprising a polymer or copolymer of a 3,4-dialkoxythiophene in which the two alkoxy groups may be the same or different or together represent an optionally substituted oxy-alkylene-oxy bridge, a polyanion and a non-Newtonian binder, wherein said non-Newtonian binder is a homopolymer or copolymer of acrylic acid crosslinked with a polyalkenyl polyether.

9. A method for preparing a conductive layer comprising: applying an aqueous composition, containing a polymer or copolymer of a 3,4-dialkoxythiophene in which the two alkoxy groups may be the same or different or together represent an optionally substituted oxy-alkylene-oxy bridge, a polyanion and a non-Newtonian binder, to an optionally subbed support, a dielectric layer, a phosphor layer or an optionally transparent conductive coating; and drying the thereby applied aqueous composition, wherein said non-Newtonian binder is a homopolymer or copolymer of acrylic acid crosslinked with a polyalkenyl polyether.

10. An antistatic layer prepared according to a method for preparing a conductive layer comprising: applying an aqueous composition, containing a polymer or copolymer of a 3,4-dialkoxythiophene in which the two alkoxy groups may be the same or different or together represent an optionally substituted oxy-alkylene-oxy bridge, a polyanion and a non-Newtonian binder, said non-Newtonian binder being a homopolymer or copolymer of acrylic acid crosslinked with a polyalkenyl polyether, to an optionally subbed support, a dielectric layer, a phosphor layer or an optionally transparent conductive coating; and drying the thereby applied aqueous composition.

11. An electroconductive layer prepared according to a method for preparing a conductive layer comprising: applying an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder, said non-Newtonian binder being a homopolymer or copolymer of acrylic acid crosslinked with a polyalkenyl polyether, to an optionally subbed support, a dielectric layer, a phosphor layer or an optionally transparent conductive coating; and drying the thereby applied aqueous composition.

12. A printing ink or paste comprising an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder, wherein said non-Newtonian binder is a homopolymer or copolymer of acrylic acid crosslinked with a polyalkenyl polyether.

13. Printing ink or paste according to claim 12, wherein said printing ink or paste is a lithographic printing ink, a gravure printing ink, a flexographic printing ink, a silk screen printing ink, an ink-jet printing ink or an offset printing ink.

14. A printing process comprising: providing a printing ink or paste comprising an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder said non-Newtonian binder being a homopolymer or copolymer of acrylic acid crosslinked with a polyalkenyl polyether; printing said printing ink or paste on an optionally subbed support, a dielectric layer, a phosphor layer or an optionally transparent conductive coating.

* * * * *